United States Patent
Davydov et al.

(10) Patent No.: US 10,939,423 B2
(45) Date of Patent: Mar. 2, 2021

(54) MULTIPLEXING TRANSMISSION TIME INTERVALS (TTIS) WITH PHYSICAL DOWNLINK SHARED CHANNEL (PDSCH) PUNCTURING DETECTION

(71) Applicant: APPLE INC, Cupertino, CA (US)

(72) Inventors: Alexei Davydov, Nizhny Novgorod (RU); Seunghee Han, San Jose, CA (US); Victor Sergeev, Nizhny Novgorod (RU); Hong He, Beijing (CN); Christian Ibars Casas, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/765,778

(22) PCT Filed: Jun. 23, 2016

(86) PCT No.: PCT/US2016/038969
§ 371 (c)(1),
(2) Date: Apr. 4, 2018

(87) PCT Pub. No.: WO2017/074520
PCT Pub. Date: May 4, 2017

(65) Prior Publication Data
US 2018/0288745 A1 Oct. 4, 2018

Related U.S. Application Data

(60) Provisional application No. 62/248,889, filed on Oct. 30, 2015.

(51) Int. Cl.
*H04W 72/04* (2009.01)
*H04L 1/00* (2006.01)
(Continued)

(52) U.S. Cl.
CPC ..... *H04W 72/042* (2013.01); *H03M 13/6362* (2013.01); *H04L 1/0045* (2013.01);
(Continued)

(58) Field of Classification Search
None
See application file for complete search history.

(56) References Cited

U.S. PATENT DOCUMENTS

2009/0092103 A1* 4/2009 Rao ............. H04L 1/0026
370/336
2010/0097937 A1  4/2010 Pietraski et al.
(Continued)

FOREIGN PATENT DOCUMENTS

WO  2011044172 A2  4/2011
WO  2014182285 A1  11/2014

OTHER PUBLICATIONS

"On Multiplexing of PDSCH with different TTIs and related enhancements." Source: Intel Corporation, Agenda item: 7.3.4.4. 3GPP TSG RAN WG1 Meeting #84, St. Julian's, Malta, Feb. 15-19, 2016. R1-160362. 3 pages.

(Continued)

*Primary Examiner* — Faruk Hamza
*Assistant Examiner* — Cassandra L Decker
(74) *Attorney, Agent, or Firm* — Eschweiler & Potashnik, LLC

(57) ABSTRACT

Techniques for detecting puncturing of a first PDSCH (physical downlink shared channel) associated with a UE (user equipment) by a second PDSCH with a shorter TTI (transmission time interval) are discussed. A base station (e.g., Evolved NodeB or eNB) can configure the UE for potential puncturing and/or parameter(s) of the second PDSCH. The UE can detect puncturing of the first PDSCH based on the configuration, and can discard punctured symbols to mitigate interference from the second PDSCH.

19 Claims, 7 Drawing Sheets

(51) Int. Cl.
    *H04L 5/00*         (2006.01)
    *H04M 13/00*      (2006.01)
    *H04W 76/27*      (2018.01)
    *H04L 27/26*      (2006.01)
    *H03M 13/09*      (2006.01)
    *H03M 13/11*      (2006.01)
    *H03M 13/41*      (2006.01)
    *H03M 13/29*      (2006.01)
    *H03M 13/23*      (2006.01)
    *H03M 13/00*      (2006.01)

(52) U.S. Cl.
    CPC .......... *H04L 1/0068* (2013.01); *H04L 5/0037* (2013.01); *H04L 5/0044* (2013.01); *H04L 5/0048* (2013.01); *H04L 5/0062* (2013.01); *H04L 27/2627* (2013.01); *H04W 72/0446* (2013.01); *H04W 76/27* (2018.02); *H03M 13/09* (2013.01); *H03M 13/1102* (2013.01); *H03M 13/23* (2013.01); *H03M 13/2957* (2013.01); *H03M 13/41* (2013.01); *H04L 5/0007* (2013.01); *H04L 5/0091* (2013.01)

(56) References Cited

U.S. PATENT DOCUMENTS

| | | | | |
|---|---|---|---|---|
| 2011/0081901 A1* | 4/2011 | Moulsley | ............... | H04B 7/024 455/422.1 |
| 2011/0243098 A1* | 10/2011 | Koivisto | ............. | H04B 7/0469 370/335 |
| 2012/0134344 A1* | 5/2012 | Yu | ......................... | H04W 72/14 370/336 |
| 2012/0177011 A1* | 7/2012 | Xi | ........................ | H04B 7/0404 370/335 |
| 2012/0328031 A1* | 12/2012 | Pajukoski | ............ | H04B 7/0469 375/259 |
| 2013/0003569 A1* | 1/2013 | Lindoff | ................. | H04L 1/0045 370/252 |
| 2013/0114496 A1* | 5/2013 | Mazzarese | ............ | H04L 5/0023 370/312 |
| 2013/0223245 A1* | 8/2013 | Taoka | .................. | H04B 7/0452 370/252 |
| 2013/0315114 A1* | 11/2013 | Seo | ......................... | H04L 5/001 370/280 |
| 2014/0071915 A1* | 3/2014 | Papasakellariou | .... | H04L 5/0053 370/329 |
| 2014/0071954 A1 | 3/2014 | Au et al. | | |
| 2014/0321370 A1* | 10/2014 | Chen | .................... | H04L 1/0038 370/329 |
| 2014/0334397 A1 | 11/2014 | Chen et al. | | |
| 2015/0029903 A1 | 1/2015 | Chen et al. | | |
| 2015/0326290 A1* | 11/2015 | Harrison | ............... | H04B 7/0456 375/260 |
| 2016/0234857 A1* | 8/2016 | Chen | .................. | H04W 72/1231 |
| 2016/0309542 A1* | 10/2016 | Kowalski | ............... | H04W 76/27 |
| 2017/0318564 A1* | 11/2017 | Lee | .......................... | H04L 1/00 |

OTHER PUBLICATIONS

International Search Report dated Sep. 9, 2016 for International Application PCT/US2016/038969.

* cited by examiner

MULTIPLEXING TRANSMISSION TIME INTERVALS (TTIS) WITH PHYSICAL DOWNLINK SHARED CHANNEL (PDSCH) PUNCTURING DETECTION

REFERENCE TO RELATED APPLICATIONS

This application is a National Phase entry application of International Patent Application No. PCT/US2016/038969 filed Jun. 23, 2016, which claims priority to U.S. Provisional Application 62/248,889 filed on Oct. 30, 2015, entitled "TTIS MUILTIPLEXING WITH PDSCH PUNCTURING DETECTION FOR LOW LATENCY LTE-A" in the name of Alexei Davydov et al. and is hereby incorporated by reference in its entirety.

FIELD

The present disclosure relates to wireless technology, and more specifically to techniques for multiplexing transmissions associated with different transmission time intervals (TTIs) in wireless communication systems.

BACKGROUND

Low latency is a design target in the development of 5G (fifth generation) and LTE (Long Term Evolution) systems. Due to properties of the internet protocols, lower latency over the wireless interface can facilitate higher data rates in conjunction with carrier-aggregation enhancements. To facilitate the increasing data rates over the past few LTE releases, the achievable latency should evolve in a similar manner. In addition, lower latency will also enable support for new applications. Some of the envisioned applications, such as traffic safety/control and control of critical infrastructure and industry processes, may require very low latency. Consequently, with these two aspects in mind, 3GPP (the Third Generation Partnership Project) will, in release 14 and beyond, standardize enhancements providing reduced latency. Examples of technologies considered in this work are instant uplink access, transmission-time interval (TTI) shortening (to 7, 2 or even 1 OFDM (Orthogonal Frequency Division Multiplexing) symbols), and reduced processing time in terminals and base stations.

DETAILED DESCRIPTION

Figure 1:
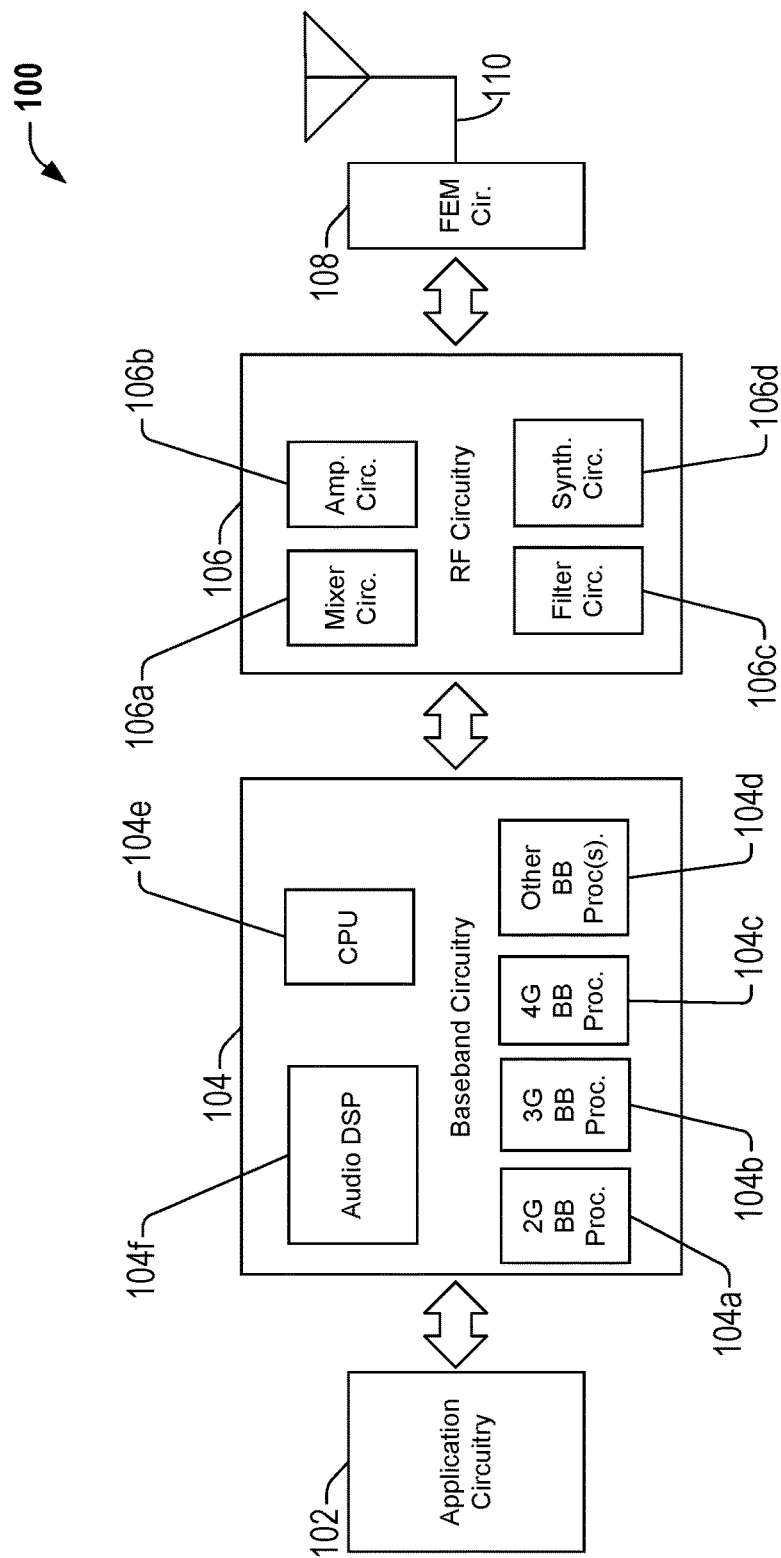
FIG. 1 is a block diagram illustrating an example user equipment (UE) useable in connection with various aspects described herein.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Embodiments described herein may be implemented into a system using any suitably configured hardware and/or software. FIG. 1 illustrates, for one embodiment, example components of a User Equipment (UE) device 100. In some embodiments, the UE device 100 may include application circuitry 102, baseband circuitry 104, Radio Frequency (RF) circuitry 106, front-end module (FEM) circuitry 108 and one or more antennas 110, coupled together at least as shown.

The application circuitry 102 may include one or more application processors. For example, the application circuitry 102 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage and may be configured to execute instructions stored in the memory/storage to enable various applications and/or operating systems to run on the system.

The baseband circuitry 104 may include circuitry such as, but not limited to, one or more single-core or multi-core processors. The baseband circuitry 104 may include one or more baseband processors and/or control logic to process baseband signals received from a receive signal path of the RF circuitry 106 and to generate baseband signals for a transmit signal path of the RF circuitry 106. Baseband processing circuitry 104 may interface with the application circuitry 102 for generation and processing of the baseband signals and for controlling operations of the RF circuitry 106. For example, in some embodiments, the baseband circuitry 104 may include a second generation (2G) baseband processor 104a, third generation (3G) baseband processor 104b, fourth generation (4G) baseband processor 104c, and/or other baseband processor(s) 104d for other existing generations, generations in development or to be developed in the future (e.g., fifth generation (5G), 6G, etc.). The baseband circuitry 104 (e.g., one or more of baseband processors 104a-d) may handle various radio control functions that enable communication with one or more radio networks via the RF circuitry 106. The radio control functions may include, but are not limited to, signal modulation/demodulation, encoding/decoding, radio frequency shifting, etc. In some embodiments, modulation/demodulation circuitry of the baseband circuitry 104 may include Fast-Fourier Transform (FFT), precoding, and/or constellation mapping/demapping functionality. In some embodiments, encoding/decoding circuitry of the baseband circuitry 104 may include convolution, tail-biting convolution, turbo, Viterbi, and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 104 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) 104e of the baseband circuitry 104 may be configured to run elements of the protocol stack for signaling of the PHY, MAC, RLC, PDCP and/or RRC layers. In some embodiments, the baseband circuitry may include one or more audio digital signal processor(s) (DSP) 104f. The audio DSP(s) 104f may be include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 104 and the application circuitry 102 may be implemented together such as, for example, on a system on a chip (SOC).

In some embodiments, the baseband circuitry 104 may provide for communication compatible with one or more radio technologies. For example, in some embodiments, the baseband circuitry 104 may support communication with an evolved universal terrestrial radio access network (EUTRAN) and/or other wireless metropolitan area networks (WMAN), a wireless local area network (WLAN), a wireless personal area network (WPAN). Embodiments in which the baseband circuitry 104 is configured to support radio communications of more than one wireless protocol may be referred to as multi-mode baseband circuitry.

RF circuitry 106 may enable communication with wireless networks using modulated electromagnetic radiation through a non-solid medium. In various embodiments, the RF circuitry 106 may include switches, filters, amplifiers, etc. to facilitate the communication with the wireless network. RF circuitry 106 may include a receive signal path which may include circuitry to down-convert RF signals received from the FEM circuitry 108 and provide baseband signals to the baseband circuitry 104. RF circuitry 106 may also include a transmit signal path which may include circuitry to up-convert baseband signals provided by the baseband circuitry 104 and provide RF output signals to the FEM circuitry 108 for transmission.

In some embodiments, the RF circuitry 106 may include a receive signal path and a transmit signal path. The receive signal path of the RF circuitry 106 may include mixer circuitry 106a, amplifier circuitry 106b and filter circuitry 106c. The transmit signal path of the RF circuitry 106 may include filter circuitry 106c and mixer circuitry 106a. RF circuitry 106 may also include synthesizer circuitry 106d for synthesizing a frequency for use by the mixer circuitry 106a of the receive signal path and the transmit signal path. In some embodiments, the mixer circuitry 106a of the receive signal path may be configured to down-convert RF signals received from the FEM circuitry 108 based on the synthesized frequency provided by synthesizer circuitry 106d. The amplifier circuitry 106b may be configured to amplify the down-converted signals and the filter circuitry 106c may be a low-pass filter (LPF) or band-pass filter (BPF) configured to remove unwanted signals from the down-converted signals to generate output baseband signals. Output baseband signals may be provided to the baseband circuitry 104 for further processing. In some embodiments, the output baseband signals may be zero-frequency baseband signals, although this is not a requirement. In some embodiments, mixer circuitry 106a of the receive signal path may comprise passive mixers, although the scope of the embodiments is not limited in this respect.

In some embodiments, the mixer circuitry 106a of the transmit signal path may be configured to up-convert input baseband signals based on the synthesized frequency provided by the synthesizer circuitry 106d to generate RF output signals for the FEM circuitry 108. The baseband signals may be provided by the baseband circuitry 104 and may be filtered by filter circuitry 106c. The filter circuitry 106c may include a low-pass filter (LPF), although the scope of the embodiments is not limited in this respect.

In some embodiments, the mixer circuitry 106a of the receive signal path and the mixer circuitry 106a of the transmit signal path may include two or more mixers and may be arranged for quadrature downconversion and/or upconversion respectively. In some embodiments, the mixer circuitry 106a of the receive signal path and the mixer circuitry 106a of the transmit signal path may include two or more mixers and may be arranged for image rejection (e.g., Hartley image rejection). In some embodiments, the mixer circuitry 106a of the receive signal path and the mixer circuitry 106a may be arranged for direct downconversion and/or direct upconversion, respectively. In some embodiments, the mixer circuitry 106a of the receive signal path and the mixer circuitry 106a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 106 may include analog-to-digital converter (ADC) and digital-to-analog converter (DAC) circuitry and the baseband circuitry 104 may include a digital baseband interface to communicate with the RF circuitry 106.

In some dual-mode embodiments, a separate radio IC circuitry may be provided for processing signals for each spectrum, although the scope of the embodiments is not limited in this respect.

In some embodiments, the synthesizer circuitry 106d may be a fractional-N synthesizer or a fractional N/N+1 synthesizer, although the scope of the embodiments is not limited in this respect as other types of frequency synthesizers may be suitable. For example, synthesizer circuitry 106d may be a delta-sigma synthesizer, a frequency multiplier, or a synthesizer comprising a phase-locked loop with a frequency divider.

The synthesizer circuitry 106d may be configured to synthesize an output frequency for use by the mixer circuitry 106a of the RF circuitry 106 based on a frequency input and a divider control input. In some embodiments, the synthesizer circuitry 106d may be a fractional N/N+1 synthesizer.

In some embodiments, frequency input may be provided by a voltage controlled oscillator (VCO), although that is not a requirement. Divider control input may be provided by either the baseband circuitry 104 or the applications processor 102 depending on the desired output frequency. In some embodiments, a divider control input (e.g., N) may be determined from a look-up table based on a channel indicated by the applications processor 102.

Synthesizer circuitry 106d of the RF circuitry 106 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 106d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 106 may include an IQ/polar converter.

FEM circuitry 108 may include a receive signal path which may include circuitry configured to operate on RF signals received from one or more antennas 110, amplify the received signals and provide the amplified versions of the received signals to the RF circuitry 106 for further processing. FEM circuitry 108 may also include a transmit signal path which may include circuitry configured to amplify signals for transmission provided by the RF circuitry 106 for transmission by one or more of the one or more antennas 110.

In some embodiments, the FEM circuitry 108 may include a TX/RX switch to switch between transmit mode and receive mode operation. The FEM circuitry may include a receive signal path and a transmit signal path. The receive signal path of the FEM circuitry may include a low-noise amplifier (LNA) to amplify received RF signals and provide the amplified received RF signals as an output (e.g., to the RF circuitry 106). The transmit signal path of the FEM circuitry 108 may include a power amplifier (PA) to amplify input RF signals (e.g., provided by RF circuitry 106), and one or more filters to generate RF signals for subsequent transmission (e.g., by one or more of the one or more antennas 110.

In some embodiments, the UE device 100 may include additional elements such as, for example, memory/storage, display, camera, sensor, and/or input/output (I/O) interface.

Additionally, although the above example discussion of device 100 is in the context of a UE device, in various aspects, a similar device can be employed in connection with a base station (BS) such as an Evolved NodeB (eNB).

In various aspects, the shortened transmission-time interval (TTI) of 5G (fifth generation) and LTE-A (Long Term Evolution-Advanced) systems can co-exist with the legacy TTI. In various embodiments, multiplexing of the conventional resource allocation and the resource allocation with shortened TTI can have a minimum impact on each other. One conventional approach supporting such co-existence relies on puncturing the shortened-TTI-PDSCH (physical downlink shared channel) to the legacy PDSCH region, while another employs FDM (frequency division multiplexing) multiplexing between shortened TTI and legacy TTI. The puncturing option to the legacy PDSCH region can have good efficiency in terms of resource utilization, since both shortened TTI and legacy TTI PDSCHs can be scheduled by demand. However, the puncturing of the PDSCH with shortened TTI to legacy TTI creates strong intra-cell interference on the received PDSCH. Techniques discussed herein can facilitate proper handling of the PDSCH puncturing at the UE receiver, which can minimize the impact of such interference.

Figure 2:
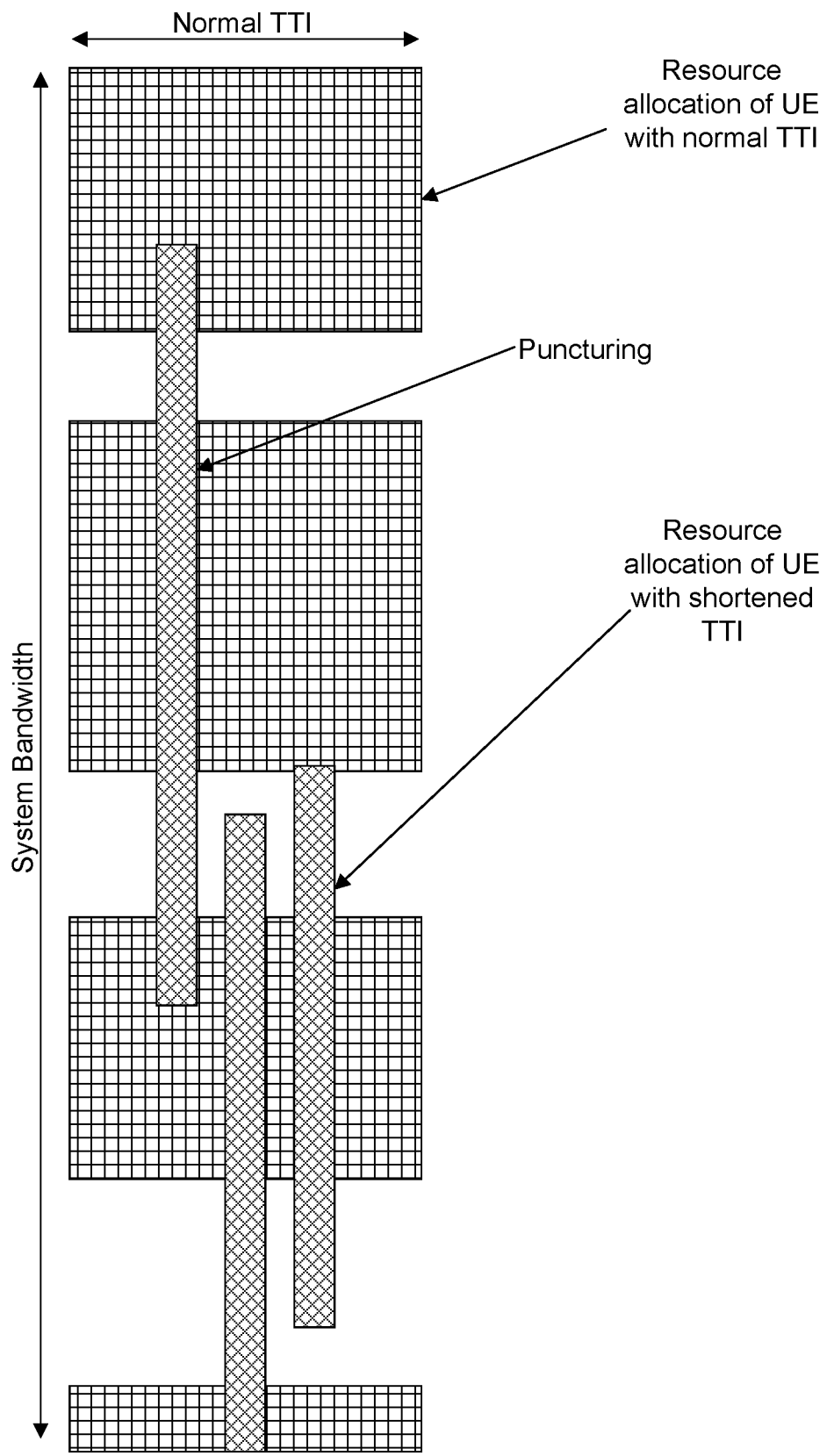
FIG. 2 is a diagram illustrating an example scenario of a first PDSCH (Physical Downlink Shared Channel) having a legacy or normal TTI (Transmission Time Interval) punctured by a second PDSCH having a shortened TTI according to various aspects described herein.

In a network employing techniques described herein, an eNB (Evolved NodeB) can support simultaneous operation of downlink PDSCH with normal and shortened TTIs. For example, within a single downlink subframe, the PDSCH of different TTIs can be multiplexed with each other. Due to the limited number of OFDM symbols, the resource allocation of the PDSCH with shortened TTI is likely to be wideband (e.g., occupying a large number of PRBs (physical resource blocks) across frequency). As the result, the PDSCH with normal TTI can be punctured by the PDSCH with shortened TTI. Referring to FIG. 2, illustrated is an example scenario of a first PDSCH (shown with horizontal and vertical cross-hatching) having a legacy or normal TTI (e.g., 14 symbols for normal cyclic prefix (CP)) punctured by a second PDSCH (shown with diagonal cross-hatching) having a shortened TTI (e.g., 7 or fewer symbols) according to various aspects described herein.

Figure 3:
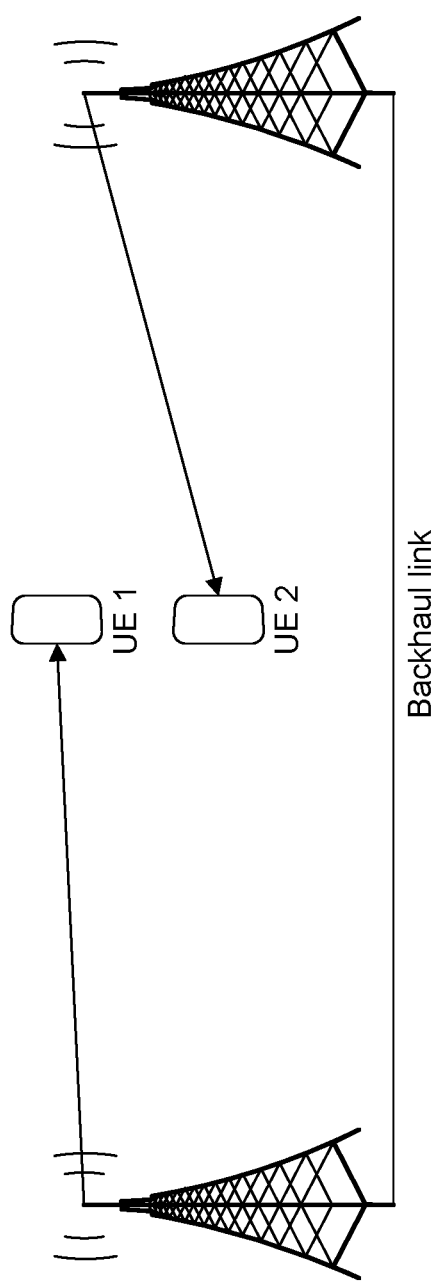
FIG. 3 is a diagram illustrating an example scenario of inter-cell interference that can be mitigated by a NAICS (Network-Assisted Interference Cancellation and Suppression) receiver.

In various aspects described herein, existing capabilities of some UEs configured to receive PDSCH with a normal TTI can be employed to detect puncturing of a PDSCH with a normal TTI by another PDSCH with a shortened TTI. Inter-cell interference is regarded as one of the dominant limiting factors for achieving higher network capacity. In conventional systems, inter-cell interference is mitigated by using coordinated multi-point techniques (CoMP) which help to avoid interference by algorithms implemented at the transmitting base station (i.e., at the network side). However, a recent study conducted by RAN4 (Radio Access Network (RAN) Working Group (WG) 4) has shown that interference mitigation at the UE side can also provide promising spectral efficiency gains by considering the spatial properties of the interference using linear MMSE-IRC (Minimum Mean Squared Error—Interference Rejection Combining) or non-linear Network-Assisted Interference Cancellation and Suppression (NAICS) receivers. Referring to FIG. 3, illustrated is an example scenario of inter-cell interference that can be mitigated by a NAICS receiver.

The enhancements for interference mitigation at the UE side can be achieved by considering more advanced NAICS receivers such as Reduced Maximum Likelihood (R-ML) or symbol level interference cancellation (SLIC) receivers which can utilize additional information about interference structure. For example, NAICS receivers can estimate the interference parameters such as the transmission mode, interference presence, power offset(s), modulation order and precoding, etc., to facilitate advanced interference cancellation and suppression. In order to facilitate operation of such receivers some higher-layer signaling assistance on the parameters of interfering signal can be considered (e.g. MBSFN (Multimedia Broadcast multicast service Single Frequency Network) subframe pattern, power offset subset, number of CRS (Cell-specific Reference Signal) APs (antenna ports), set of the transmission modes, Cell ID, etc.). Table 1 below provides a summary of signal parameters that can be provided for signaling assistance and blind detection at the UE.

TABLE 1

Summary of Rel-12 NAICS signaling assistance and blind detection of the parameters

|  | Parameter | Signaling assistance |
| --- | --- | --- |
| General | Basic CRS assistance information (Cell ID, MBSFN pattern, Number of CRS APs) | Higher-layer (HL) signaling |
|  | $P_B$ | HL signaling |
|  | Synchronization of CP, slot, SFN, subframe and common system BW | Explicitly assumed when HL signaling is present |
|  | ZP and NZP CSI-RS configurations | No signaling |
|  | PDSCH starting position (CFI) | No signaling |
|  | Transmission Mode (TM) | Blind detection (BD). HL signaling on TM subset. |
| For CRS-based PDSCH-IS/IC | PDSCH presence | BD |
|  | Modulation format | BD |
|  | PMI/RI for CLSM | BD for 2 CRS APs. FFS (No support of NAICS or BD) for 4 CRS APs. |
|  | Data to RS EPRE ($P_A$) | BD w/ HL signaling of Pa subset. Subset size is 3. |
|  | PDSCH presence (incl. nSCID, DMRS APs) | BD |
|  | Modulation format | BD |
|  | Virtual Cell ID for TM10 | No signaling. UE is not expected to cancel and suppress interference from TM10. |
|  | Quasi co-location information for TM10 | No signaling. UE is not expected to cancel and suppress interference from TM10. |

TABLE 1-continued

Summary of Rel-12 NAICS signaling assistance and blind detection of the parameters

| Parameter | | Signaling assistance |
|---|---|---|
| Interferer parameters granularity | PDSCH resource allocation and precoding granularity | Interferer parameters are assumed to have granularity of at least 1 PRB pair A larger granularity in frequency can be signaled to UE without any impact on scheduling in the network. The possible values are {1, 2, 3, 4} RBs |

In various embodiments, techniques disclosed herein can be employed to minimize the performance loss due to PDSCH puncturing, such as by using higher layer configuration of the signal parameters corresponding to the PDSCH with shortened TTI. Detection of PDSCH puncturing by the UE receiving PDSCH with normal TTI can be facilitated by using the receivers with blind detection of the received signal parameters in connection with higher layer signaling assistance. In aspects, when the puncturing on some OFDM symbols are detected (e.g., detected parameters of the signal doesn't match to the parameter of the useful PDSCH), a receiving UE can discard the corresponding LLRs (log likelihood ratios) received from the corresponding REs (resource elements) during decoding.

Figure 4:
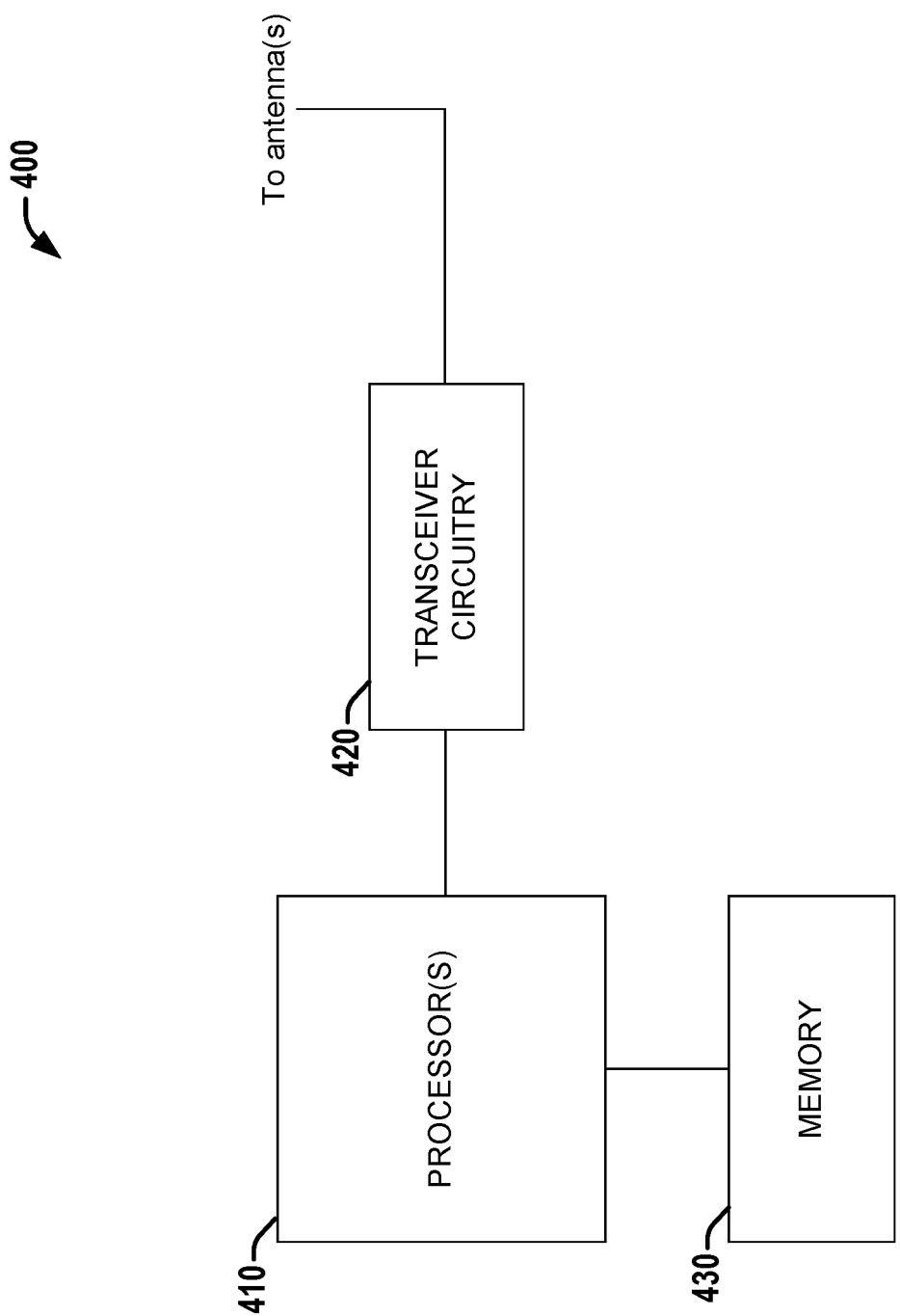
FIG. 4 is a block diagram illustrating a system that facilitates configuration by a base station of a UE (User Equipment) to detect puncturing of the UE's PDSCH by another PDSCH having a shorter TTI than the TTI of the UE's PDSCH, according to various aspects described herein.

Referring to FIG. 4, illustrated is a block diagram of a system 400 that facilitates configuration by a base station of a UE (User Equipment) to detect puncturing of the UE's PDSCH (Physical Downlink Shared Channel) by another PDSCH having a shorter TTI (transmission time interval) than the TTI of the UE's PDSCH, according to various aspects described herein. System 400 can include one or more processors 410 (e.g., one or more baseband processors such as one or more of the baseband processors discussed in connection with FIG. 1), transceiver circuitry 420 (e.g., which can comprise one or more of transmitter circuitry (e.g., associated with one or more transmit chains) or receiver circuitry (e.g., associated with one or more receive chains), wherein the transmitter circuitry and receiver circuitry can employ common circuit elements, distinct circuit elements, or a combination thereof), and memory 430 (which can comprise any of a variety of storage mediums and can store instructions and/or data associated with one or more of processor(s) 410 or transceiver circuitry 420). In various aspects, system 400 can be included within an Evolved Universal Terrestrial Radio Access Network (E-UTRAN) Node B (Evolved Node B, eNodeB, or eNB) or other base station in a wireless communications network. In some aspects, the processor(s) 410, transceiver circuitry 420, and the memory 430 can be included in a single device, while in other aspects, they can be included in different devices, such as part of a distributed architecture. As described in greater detail below, system 400 can facilitate generation of higher layer signaling to a UE that can facilitate detection by the UE of puncturing of a PDSCH of that UE.

Processor(s) 410 can schedule a first set of downlink (DL) transmissions to a first set of UEs, which can be scheduled via a first PDSCH associated with a first TTI (e.g., a normal or legacy TTI of 14 symbols for normal CP), and can schedule a second set of DL transmissions to a second set of UEs, which can be scheduled via a second PDSCH associated with a shortened TTI (e.g., of 7 or fewer symbols, e.g., 7 symbols, 2 symbols, 1 symbol, etc.). Because of the longer TTI of the first PDSCH, scheduling decisions associated with the first PDSCH can be made less frequently (e.g., every 1 ms, etc.) than scheduling decisions associated with the second PDSCH (e.g., less than every 1 ms, for example, every symbol, etc.). Thus, in some situations, physical resources may have already been scheduled in connection with the first PDSCH when scheduling decisions about those physical resources are made in connection with the second PDSCH. In some situations, processor(s) 410 can schedule the first PDSCH (for first UE(s) of the first set of UEs) and the second set of PDSCH (for second UE(s) of the second set of UEs) to overlapping physical resources. To avoid heavy interference at first UEs of the first set of UEs, processor(s) 410 can generate one or more control messages that processor(s) 410 can output to transceiver circuitry 420, which can transmit the one or more control messages to first UEs of the first set of UEs, to facilitate interference mitigation by the first set of UEs.

In general, the first set of UEs can comprise one or more first UEs and/or the second set of UEs can comprise one or more second UEs. However, to simplify the following discussion, a single first UE and a single second UE are discussed, where it is to be understood that additional first UEs and/or second UEs can also be scheduled and configured in a similar manner to that described below.

Processor(s) 410 can configure a first UE for potential puncturing of a first PDSCH associated with the first UE by a second PDSCH (e.g., which can have a shorter TTI). Processor(s) 410 can configure the first UE via generating one or more control messages that can facilitate cancellation by the first UE of interference caused by the second PDSCH and outputting the control message(s) to transceiver circuitry 420, which can transmit the control message(s) to the first UE. In some aspects, processor(s) 410 can output the control message(s) for transmission by transceiver circuitry 420 as RRC (radio resource control) message(s), while in other aspects, processor(s) 410 can output the control message(s) for transmission by transceiver circuitry 420 as DCI (downlink control information) message(s). Depending on the type of signal or message generated, outputting for transmission (e.g., by processor(s) 410, processor(s) 510, etc.) can comprise one or more of: generating a set of associated bits that indicate the content of the signal or message, coding (e.g., which can include adding a cyclic redundancy check (CRC) and/or coding via one or more of turbo code, low density parity-check (LDPC) code, tailbiting convolution code (TBCC), etc.), scrambling (e.g., based on a scrambling seed), modulating (e.g., via one of binary phase shift keying (BPSK), quadrature phase shift keying (QPSK), or some form of quadrature amplitude modulation (QAM), etc.), and/or resource mapping (e.g., to a set of time and frequency resources granted for uplink transmission, etc.).

In various aspects, the control message(s) can indicate that the first PDSCH is subject to potential puncturing, such that the first UE can implement associated interference cancellation techniques. In some aspects, the control message(s) can indicate one or more parameters or potential parameters of the second PDSCH or DL transmission(s) via the second PDSCH. In aspects, these parameters can include any such parameters discussed herein, such as parameters shown in Table 1, above. For example, parameter(s) can comprise one or more of the following associated with the second PDSCH or DL transmission(s) thereof: virtual cell ID(s) of user-specific reference signal(s), power offset(s), transmission scheme(s), modulation order(s) and/or modulation scheme(s), precoding matrix(es), codebook(s) of precoding vectors, number of OFDM symbols (e.g., the length of the shorter TTI (e.g., 1-7 symbols, etc.) of the second PDSCH), number of adjacent PRBs (Physical Resource Blocks) occupied by the second PDSCH (e.g., 1-6, or more, etc.).

Processor(s) 410 can schedule a first DL transmission to the first UE via the first PDSCH (e.g., having a normal or legacy TTI of 14 symbols for normal CP) in a first set of physical resources, and can schedule a second DL transmission to the second UE via the second PDSCH (e.g., having a shortened TTI, for example, of 7 or fewer symbols, etc.) in a second set of physical resources. In general, the first set of physical resources and the second set of physical resources can potentially overlap in that both comprise a common overlapping set of physical resources.

Processor(s) 410 can output a first set of data to transceiver circuitry 420 for transmission by transceiver circuitry 420 to the first UE via the first PDSCH in a subset of the first set of physical resources that excludes the overlapping set of physical resources (e.g., the set formed by subtracting the overlapping set of physical resources from the first set of physical resources (and potentially also subtracting any other overlapping sets of physical resources, in embodiments wherein more than one second UE is scheduled overlapping with the first set of physical resources)).

Additionally, processor(s) 410 can output a second set of data to transceiver circuitry 420 for transmission by transceiver circuitry 420 to the second UE via the second PDSCH in the second set of physical resources (e.g., including the overlapping set of physical resources).

Although the first UE can be scheduled in the first set of physical resources and the second PDSCH can be transmitted via at least a portion of the first set of physical resources (e.g., the overlapping set of resources), the first UE can employ interference cancellation techniques as described herein based on the control message(s) that can configure the first UE for potential puncturing of the first PDSCH, as described herein.

Figure 5:
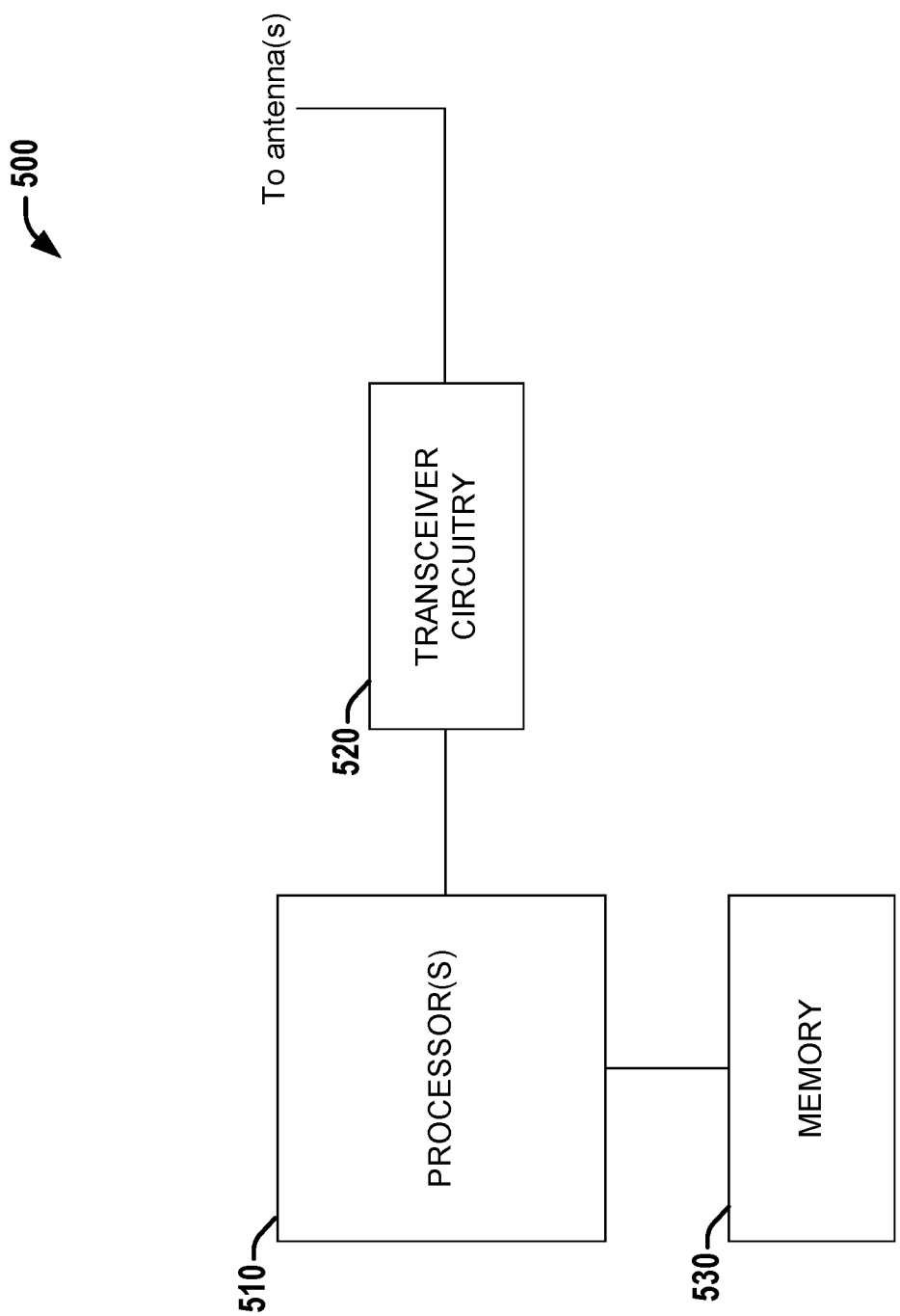
FIG. 5 is a block diagram illustrating a system that facilitates detection by a UE of puncturing of a PDSCH associated with that UE by another PDSCH having a shorter TTI, according to various aspects described herein.

Referring to FIG. 5, illustrated is a block diagram of a system 500 that facilitates detection by a UE of puncturing of a PDSCH associated with that UE by another PDSCH having a shorter TTI, according to various aspects described herein. System 500 can include one or more processors 510 (e.g., one or more baseband processors such as one or more of the baseband processors discussed in connection with FIG. 1), transceiver circuitry 520 (e.g., comprising one or more of transmitter circuitry or receiver circuitry, which can employ common circuit elements, distinct circuit elements, or a combination thereof), and a memory 530 (which can comprise any of a variety of storage mediums and can store instructions and/or data associated with one or more of processor(s) 510 or transceiver circuitry 520). In various aspects, system 500 can be included within a user equipment (UE). As described in greater detail below, system 500 can facilitate detection and rejection of signals within a PDSCH scheduled for the UE when those signals are associated with a distinct PDSCH having a shorter TTI.

Transceiver circuitry 520 can receive, and processor(s) 510 can process, one or more control messages from an eNB that can configure processor(s) 510 to detect and discard signals from a PDSCH not associated with the UE when that PDSCH punctures a PDSCH of the UE. Depending on the type of received signal or message, processing (e.g., by processor(s) 510, processor(s) 410, etc.) can comprise one or more of: identifying physical resources associated with the signal/message, detecting the signal/message, resource element group deinterleaving, demodulation, descrambling, and/or decoding. The control message(s) can comprise one or more of RRC message(s) or DCI message(s).

In various aspects, the control message(s) can comprise control message(s) as discussed above in connection with FIG. 4. For example, the control message(s) can indicate potential puncturing of a PDSCH of the UE (e.g., a first PDSCH, which can have a normal or legacy TTI of 14 symbols for normal CP) by a PDSCH not associated with the UE (e.g., a second PDSCH, which can have a shorter TTI than the first PDSCH, such as 7 symbols or fewer, etc.). In the same or other aspects, the control message(s) can indicate one or more parameters or potential parameters of the second PDSCH or DL transmission(s) via the second PDSCH. In aspects, these parameters can include any such parameters discussed herein, such as parameters shown in Table 1, above. For example, parameter(s) can comprise one or more of the following associated with the second PDSCH or DL transmission(s) thereof: virtual cell ID(s) of user-specific reference signal(s), power offset(s), transmission scheme(s), modulation order(s) and/or modulation scheme(s), precoding matrix(es), codebook(s) of precoding vectors, number of OFDM symbols (e.g., the length of the shorter TTI (e.g., 1-7 symbols, etc.) of the second PDSCH), number of adjacent PRBs (Physical Resource Blocks) occupied by the second PDSCH (e.g., 1-6, or more, etc.).

Additionally, transceiver circuitry 520 can receive, and processor(s) 510 can process, a DCI message that indicates a DL assignment associated with a scheduled DL transmission in the first PDSCH via a set of physical resources.

Based on the DL assignment, transceiver circuitry 520 can receive, and processor(s) 510 can process, a set of signals received via the set of physical resources. As discussed elsewhere herein, at least a portion of that set of physical resources (e.g., an overlapping set of physical resources) can also be scheduled for a distinct DL transmission to another UE via the second PDSCH. Thus, the received signals can comprise DL data for the UE sent via the first PDSCH, as well as distinct data for distinct UEs that is interference when received at the UE. Accordingly, as discussed herein, processor(s) 510 can apply interference cancellation techniques to these signals that comprise distinct data for distinct UEs based on the processed control message(s).

Processor(s) 510 can determine, for each of the signals received via the set of physical resources, whether that signal is associated with the second PDSCH (e.g., via determining a relative likelihood of that signal being associated with the second PDSCH as opposed to the first PDSCH (or some function thereof, such as a log likelihood ratio), etc.). Processor(s) 510 can make these determinations based on the control message(s) (e.g., based on the indication of potential puncturing and/or any indicated parameters of the second PDSCH and/or DL transmissions via the second PDSCH, etc.).

In some aspects, the determination can be based at least in part on processor(s) 510 estimating parameters of a received signal (e.g., modulation and coding scheme (MCS), transmission mode (TM), etc.), and comparing those parameters or parameters to those indicated via the control message(s).

In the same or other aspects, the determination can be based at least in part on processor(s) 510 estimating a covariance matrix for that received signal and comparing it to an expected covariance matrix processor(s) 510 can calculate for the second PDSCH.

In the same or other aspects, one or more received signals can be determined to be associated with the second PDSCH based on the parameters or parameters indicated in the control message(s) and determination(s) that other received signal(s) are associated with the second PDSCH. For example, the parameters can indicate a bandwidth of the second PDSCH (e.g., via a number of adjacent PRBs, etc.), and based on the subcarrier(s) of that signal and the other signal(s), processor(s) 510 can determine that signal to be associated with the second PDSCH. In some aspects, a group of adjacent PRBs (e.g., of a number indicated via the control message(s)) can be used for joint processing, for more accurate determination of whether signals correspond to the second PDSCH.

For each signal determined by processor(s) 510 to be associated with the second PDSCH, processor(s) 510 can discard that signal, such as by assigning it no weight (e.g., a LLR (log likelihood ratio) value of zero, etc.) in determining the data sent via the first PDSCH.

In various embodiments, techniques discussed herein can be employed to minimize the performance loss due to PDSCH puncturing by using higher layer configuration of the signal parameters corresponding to the PDSCH with shortened TTI (e.g., the second PDSCH discussed herein). Detection of PDSCH puncturing by a UE receiving PDSCH with normal TTI (e.g., the first PDSCH discussed herein) can be accomplished using receivers with blind detection of the received signal parameters by using higher layer signaling assistance.

Some examples of higher layer configuration of the parameters of the PDSCH with shortened TTI include: configuration of the possible PDSCH puncturing by PDSCH with shortened TTI; and/or configuration of the possible parameters related to PDSCH with shortened TTI, where the parameters can be one or more parameters described herein, such as virtual cell ID(s) of the user specific RS(s), power offset(s) of the PDSCH with shortened TTI, transmission scheme(s), modulation scheme(s), etc.

Upon reception of the higher layer configuration (e.g., configuration of the possible PDSCH puncturing by PDSCH with shortened TTI, etc.), the UE can monitor the received signal with respect to the parameters of the signal (e.g., power offset, precoding matrix, etc.). In some aspects, for each set of OFDM symbols within a PRB, the UE can estimate the parameters of the received signal and can compare them with parameters of the serving PDSCH indicated by the serving cell. In case the other parameters are detected, the corresponding OFDM symbol set can be declared as punctured.

The OFDM symbol set can correspond to the number of OFDM symbols in one TTI (e.g., of the PDSCH with shortened TTI). For example, an OFDM symbol set can be of length 1, 2 or 7 OFDM symbols. When the puncturing on some OFDM symbols are detected (e.g. detected parameters of the signal doesn't match to the parameter of the useful PDSCH), the UE can discard the corresponding LLRs received from corresponding REs during decoding. The discarding of the bits can be implemented by setting the calculated LLR values to 0 for all symbols received from the punctured REs.

The detection of the parameters can be based on the estimation of the covariance matrix of the received signal r and comparison with an emulated interference covariance matrix that can be constructed at the UE using the known parameters of the received signal (e.g., such as power offset, channel, precoding vector, transmission scheme, noise and interference power, etc.). The covariance matrix R of the signal r received from multiple antennas is defined as $R=E(r \cdot r^H)$, where $(\ )^H$ is Hermitian conjugate and $E(\ )$ is averaging function across REs. The emulated interference covariance matrix that can be constructed at the UE receiver can be defined as in equation 1:

$$R_e = \alpha^2 (HV) \cdot (HV)^H + R_{ni} \quad (1),$$

where $\alpha^2$ is power offset, H the channel, V the precoding matrix and $R_{ni}$ the covariance matrix of interference and noise. It can be assumed that all the above parameters are known to the UE receiver for construction of the matrix $R_e$. The puncturing in this case can be detected by comparing R and $R_e$.

The parameters of the received serving signal (e.g. power offset $\alpha^2$, modulation order M, precoder V) also can be detected at the UE receiver using a maximum likelihood algorithm, such as in equation 2:

$$\{\alpha, M, V\} = \underset{s,\alpha M,V}{\operatorname{argmin}} (r - HV\alpha s)^H R_{ni}^{-1} (r - HV\alpha s), \quad (2)$$

where M is modulation order of the signal. The puncturing in this case can be detected by comparing the estimated parameters with parameters of the serving PDSCH indicated to the UE using control signaling (e.g. RRC and/or DCI).

In some embodiments, to increase reliability of blind detection of the PDSCH puncturing, the UE can assume that the puncturing at the eNB is performed on a group of adjacent PRBs. In this case, the UE can perform detection of the puncturing PDSCH by joint processing of the group of adjacent PRBs.

Figure 6:
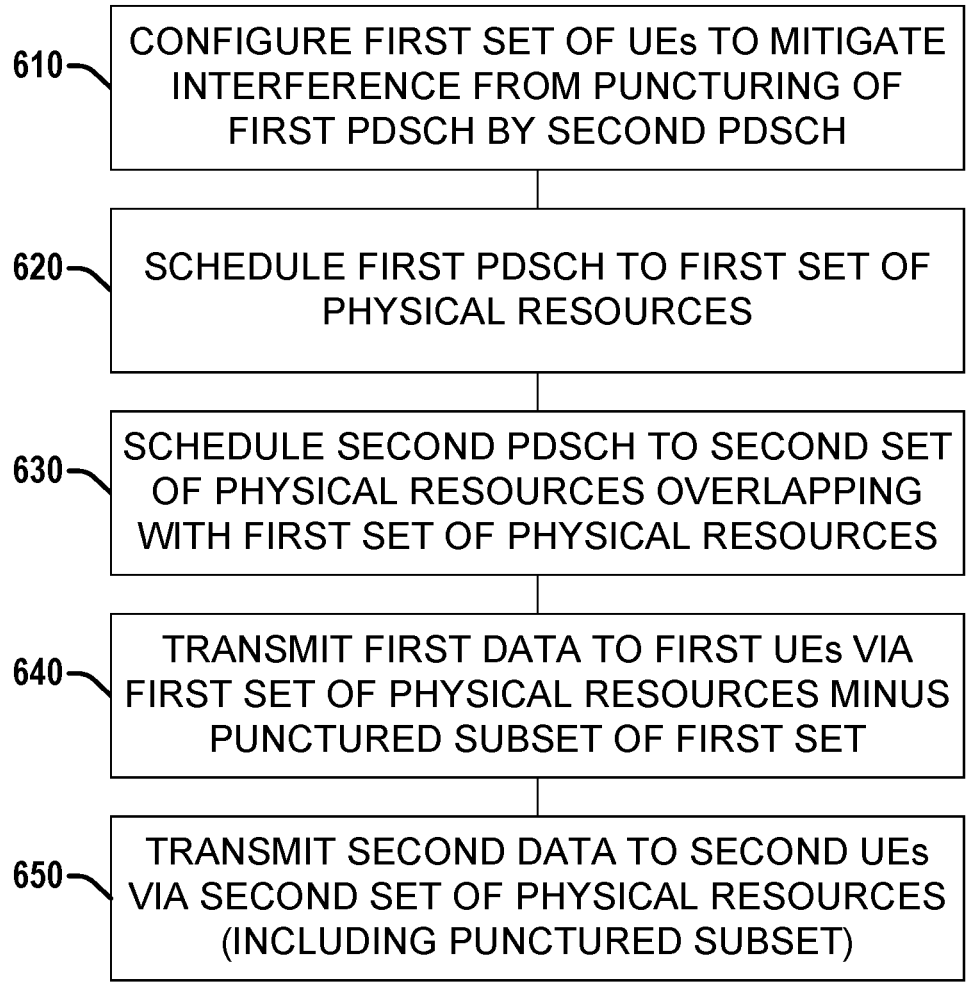
FIG. 6 is a flow diagram illustrating a method that facilitates configuration of a UE by a base station for detection by the UE of puncturing of a first PDSCH associated with the UE by a second PDSCH having a shortened TTI, according to various aspects described herein.

Referring to FIG. 6, illustrated is a flow diagram of a method 600 that facilitates configuration of a UE by a base station for detection by the UE of puncturing of a first PDSCH associated with the UE by a second PDSCH having a shortened TTI, according to various aspects described herein. In some aspects, method 600 can be performed at an eNB. In other aspects, a machine readable medium can store instructions associated with method 600 that, when executed, can cause an eNB to perform the acts of method 600.

At 610, method 600 can comprise transmitting control signaling to a first set of UEs that can configure the first set of UEs to perform interference mitigation on a first PDSCH for the first set of UEs for interference arising from a second PDSCH (e.g., with a shortened TTI relative to the first PDSCH, etc.) puncturing the first PDSCH. The control signaling can indicate that the first PDSCH is subject to potential puncturing by the second PDSCH and/or one or more parameters (e.g., which can be any parameters discussed herein) associated with the second PDSCH or DL transmissions of the second PDSCH.

At 620, the first PDSCH can be scheduled to a first set of physical resources.

At 630, the second PDSCH can be scheduled to a second set of physical resources, which can have a non-empty intersection with the first set of physical resources (e.g., they can both comprise an overlapping or punctured subset of physical resources).

At 640, a first set of data can be transmitted to the first set of UEs via the first PDSCH in a subset of the first set of physical resources formed by subtracting the punctured subset of physical resources from the first set of physical resources.

At 650, a second set of data can be transmitted to a second set of UEs via the second PDSCH in the second set of physical resources (e.g., including the punctured subset).

Figure 7:
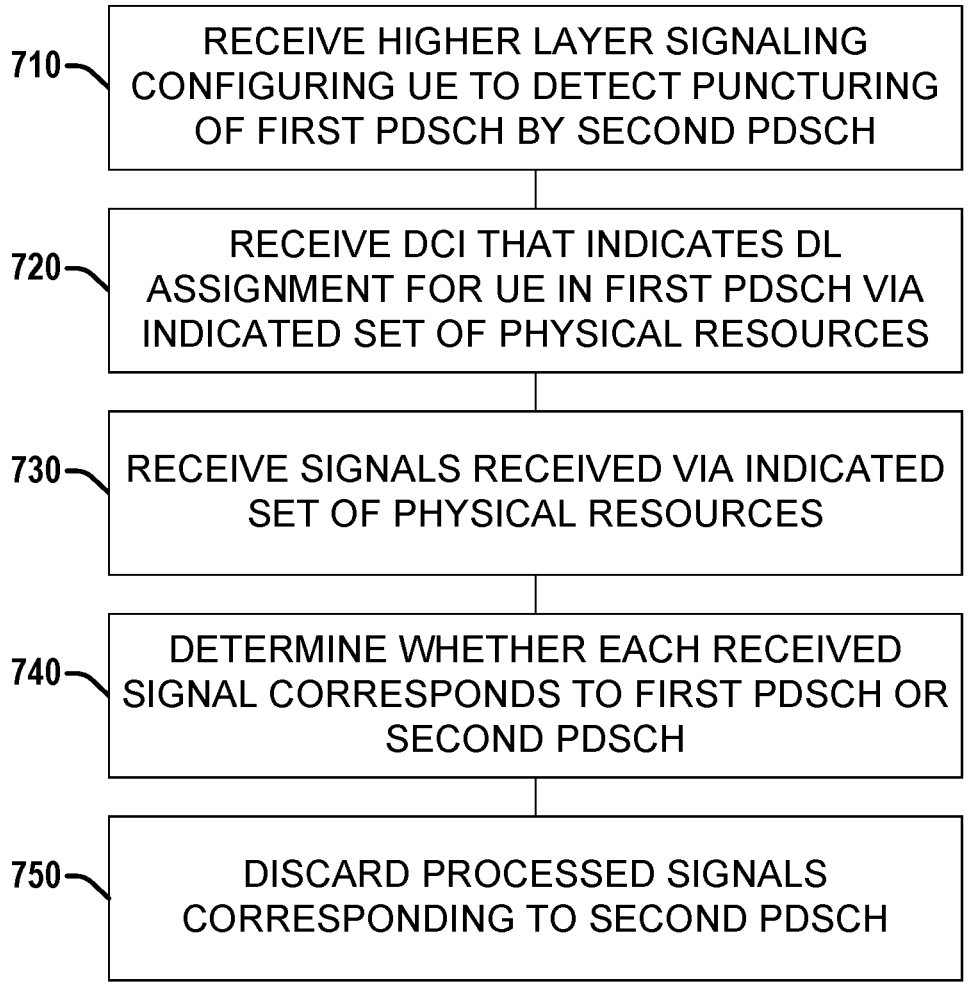
FIG. 7 is a flow diagram illustrating a method that facilitates detection by a UE of puncturing of a first PDSCH by a second PDSCH having a shortened TTI, according to various aspects described herein.

Referring to FIG. 7, illustrated is a flow diagram of a method 700 that facilitates detection by a UE of puncturing of a first PDSCH by a second PDSCH having a shortened TTI, according to various aspects described herein. In some aspects, method 700 can be performed at a UE. In other aspects, a machine readable medium can store instructions associated with method 700 that, when executed, can cause a UE to perform the acts of method 700.

At 710, method 700 can comprise receiving higher layer signaling that configures the receiving UE to detect puncturing of a first PDSCH associated with the UE by a second PDSCH having a shorter TTI than the first PDSCH. The configuration can indicate that the first PDSCH is subject to potential puncturing by the second PDSCH and/or can indicate one or more parameters of the second PDSCH (and/or DL transmissions of the second PDSCH).

At 720, a DCI message can be received that indicates a DL assignment for the UE in the first PDSCH via an indicated set of physical resources.

At 730, signals can be received via the indicated set of physical resources, which can comprise signals of the first PDSCH or of the puncturing second PDSCH.

At 740, for each of the received signals, a determination can be made whether that received signal corresponds to the second PDSCH or the first PDSCH. The determination can be based on the received higher layer signaling, for example, parameters indicated as corresponding to the second PDSCH.

At 750, each signal that was determined to correspond to the second PDSCH can be discarded, such as by setting a LLR value of that signal to zero.

Examples herein can include subject matter such as a method, means for performing acts or blocks of the method, at least one machine-readable medium including executable instructions that, when performed by a machine (e.g., a processor with memory, an application-specific integrated circuit (ASIC), a field programmable gate array (FPGA), or the like) cause the machine to perform acts of the method or of an apparatus or system for concurrent communication using multiple communication technologies according to embodiments and examples described.

Example 1 is an apparatus configured to be employed within an Evolved NodeB (eNB), comprising one or more processors configured to: schedule a first set of physical resources for a first downlink (DL) transmission to a first user equipment (UE) according to a first transmission time interval (TTI); output one or more control messages for transmission to the first UE, wherein the one or more control messages facilitate interference cancellation of a second DL transmission by the first UE; schedule a second set of physical resources for the second DL transmission to a second UE according to a second TTI that is shorter than the first TTI, wherein the first set of physical resources comprises a subset of the first set of physical resources; map first modulated DL data for the first DL transmission to a first physical downlink shared channel (PDSCH) via a subset of the first set of physical resources that excludes the subset of the first set of physical resources; and map second modulated DL data for the second DL transmission to a second PDSCH via the second set of physical resources.

Example 2 comprises the subject matter of any variation of example 1, wherein the one or more control messages indicate a potential puncturing of the first PDSCH by the second PDSCH.

Example 3 comprises the subject matter of any variation of any of examples 1-2, wherein the one or more control messages indicate one or more parameters of the second DL transmission.

Example 4 comprises the subject matter of any variation of example 3, wherein the one or more parameters of the second DL transmission comprise a virtual cell identity (ID) of a user-specific reference signal of the second DL transmission.

Example 5 comprises the subject matter of any variation of example 3, wherein the one or more parameters of the second DL transmission comprise a power offset of the second DL transmission.

Example 6 comprises the subject matter of any variation of example 3, wherein the one or more parameters of the second DL transmission comprise a transmission scheme of the second DL transmission.

Example 7 comprises the subject matter of any variation of example 3, wherein the one or more parameters of the second DL transmission comprise one or more potential modulation schemes of the second DL transmission.

Example 8 comprises the subject matter of any variation of example 3, wherein the one or more parameters of the second DL transmission comprise a codebook of precoding vectors associated with the second DL transmission.

Example 9 comprises the subject matter of any variation of example 3, wherein the one or more parameters of the second DL transmission comprise a number of orthogonal frequency division multiplexing (OFDM) symbols of the second DL transmission.

Example 10 comprises the subject matter of any variation of example 9, wherein the number of OFDM symbols of the second DL transmission is seven or fewer.

Example 11 comprises the subject matter of any variation of example 3, wherein the second set of physical resources comprises resource elements (REs) from n adjacent physical resource blocks (PRBs), and wherein the one or more parameters comprise n.

Example 12 comprises the subject matter of any variation of any of examples 3-4, wherein the one or more parameters of the second DL transmission comprise a power offset of the second DL transmission.

Example 13 comprises the subject matter of any variation of any of examples 3-4 or 12, wherein the one or more parameters of the second DL transmission comprise a transmission scheme of the second DL transmission.

Example 14 comprises the subject matter of any variation of any of examples 3-4 or 12-13, wherein the one or more parameters of the second DL transmission comprise one or more potential modulation schemes of the second DL transmission.

Example 15 comprises the subject matter of any variation of any of examples 3-4 or 12-14, wherein the one or more parameters of the second DL transmission comprise a codebook of precoding vectors associated with the second DL transmission.

Example 16 comprises the subject matter of any variation of any of examples 3-4 or 12-15, wherein the one or more parameters of the second DL transmission comprise a number of orthogonal frequency division multiplexing (OFDM) symbols of the second DL transmission.

Example 17 comprises the subject matter of any variation of example 16, wherein the number of OFDM symbols of the second DL transmission is seven or fewer.

Example 18 comprises the subject matter of any variation of any of examples 3-4 or 12-17, wherein the second set of physical resources comprises resource elements (REs) from n adjacent physical resource blocks (PRBs), and wherein the one or more parameters comprise n.

Example 19 comprises the subject matter of any variation of example 1, wherein the one or more control messages indicate one or more parameters of the second DL transmission.

Example 20 is a machine readable medium comprising instructions that, when executed, cause an Evolved NodeB (eNB) to: transmit control signaling to a first set of user equipments (UEs) to configure the first set of UEs for potential puncturing of a first physical downlink shared channel (PDSCH) by a second PDSCH having a shorter transmission time interval (TTI) than a first TTI of the first PDSCH; schedule the first PDSCH to a first set of physical resources; schedule the second PDSCH to a second set of physical resources that comprises a punctured subset of the first set of physical resources; transmit a first set of data via the first PDSCH to the first set of UEs via a subset of the first set of physical resources that excludes the punctured subset; and transmit a second set of data via the second PDSCH to a second set of UEs via the second set of physical resources.

Example 21 comprises the subject matter of any variation of example 20, wherein the control signaling indicates one or more parameters of the second PDSCH.

Example 22 comprises the subject matter of any variation of example 21, wherein the one or more parameters comprise one or more potential modulation orders of the second PDSCH.

Example 23 comprises the subject matter of any variation of example 21, wherein the one or more parameters comprise a power offset of the second PDSCH.

Example 24 comprises the subject matter of any variation of example 21, wherein the one or more parameters comprise one or more potential precoding matrices of the second PDSCH.

Example 25 comprises the subject matter of any variation of example 21, wherein the one or more parameters comprise a number of orthogonal frequency division (OFDM) symbols of the second PDSCH.

Example 26 comprises the subject matter of any variation of example 25, wherein the number of OFDM symbols of the second PDSCH is 7 or fewer.

Example 27 comprises the subject matter of any variation of any of examples 20-26, wherein the control signaling comprises one or more radio resource control (RRC) messages.

Example 28 comprises the subject matter of any variation of any of examples 20-26, wherein the control signaling comprises one or more downlink control information (DCI) messages.

Example 29 comprises the subject matter of any variation of any of examples 20-27, wherein the control signaling comprises one or more downlink control information (DCI) messages.

Example 30 comprises the subject matter of any variation of example 20, wherein the control signaling comprises one or more radio resource control (RRC) messages.

Example 31 comprises the subject matter of any variation of example 20, wherein the control signaling comprises one or more downlink control information (DCI) messages.

Example 32 is an apparatus configured to be employed within a User Equipment (UE), comprising one or more processors configured to: process one or more control messages received via transceiver circuitry, wherein the one or more control messages indicate potential puncturing of a first physical downlink shared channel (PDSCH) by a second PDSCH with a second transmission time interval (TTI) that is shorter than a first TTI of the first PDSCH, and indicate one or more indicated parameters of the second PDSCH; decode a downlink control information (DCI) message received via the transceiver circuitry, wherein the DCI message indicates a downlink (DL) assignment scheduled for the UE via an indicated set of physical resources; process a set of signals received via the transceiver circuitry via the indicated set of physical resources; determine, based on the one or more indicated parameters, whether each signal of the set of signals is associated with the first PDSCH or associated with the second PDSCH; and discard each signal associated with the second PDSCH.

Example 33 comprises the subject matter of any variation of example 32, wherein the one or more processors being configured to determine whether each signal of the set of signals is associated with the first PDSCH or associated with the second PDSCH comprises the one or more processors being configured to: calculate one or more estimated parameters of that signal; and compare the one or more estimated parameters of that signal with the one or more indicated parameters.

Example 34 comprises the subject matter of any variation of example 32, wherein the one or more processors being configured to determine whether each signal of the set of signals is associated with the first PDSCH or associated with the second PDSCH comprises the one or more processors being configured to: calculate an expected covariance matrix for that signal based on the one or more indicated parameters; calculate an actual covariance for that signal based on that signal; and compare the expected covariance matrix of that signal with the actual covariance matrix of that signal.

Example 35 comprises the subject matter of any variation of any of examples 32-34, wherein the one or more processors being configured to discard each signal associated with the second PDSCH comprises the one or more processors being configured to assign a log likelihood ratio (LLR) value of zero for each signal associated with the second PDSCH.

Example 36 comprises the subject matter of any variation of any of examples 32-34, wherein the one or more parameters comprise a number of adjacent physical resource blocks (PRBs) of a group of adjacent PRBs of the second PDSCH, and wherein, for at least one signal of the set of signals, the one or more processors is configured to determine that signal is associated with the second PDSCH based on a determination that the at least one signal is within the group of adjacent PRBs with another signal associated with the second PDSCH.

Example 37 comprises the subject matter of any variation of example 36, wherein the number of adjacent PRBs is six or fewer.

Example 38 comprises the subject matter of any variation of any of examples 32-34, wherein the one or more parameters comprise one or more potential modulation schemes of the second PDSCH.

Example 39 comprises the subject matter of any variation of any of examples 32-34, wherein the one or more parameters comprise one or more potential transmission schemes of the second PDSCH.

Example 40 comprises the subject matter of any variation of any of examples 32-34, wherein the one or more parameters comprise a codebook of precoding vectors associated with the second PDSCH.

Example 41 comprises the subject matter of any variation of any of examples 32-34, wherein the second TTI comprises seven or fewer orthogonal frequency division multiplexing (OFDM) symbols.

Example 42 comprises the subject matter of any variation of example 32, wherein the one or more processors being configured to discard each signal associated with the second PDSCH comprises the one or more processors being configured to assign a log likelihood ratio (LLR) value of zero for each signal associated with the second PDSCH.

Example 43 comprises the subject matter of any variation of example 32, wherein the one or more parameters comprise a number of adjacent physical resource blocks (PRBs) of a group of adjacent PRBs of the second PDSCH, and wherein, for at least one signal of the set of signals, the one or more processors is configured to determine that signal is associated with the second PDSCH based on a determination that the at least one signal is within the group of adjacent PRBs with another signal associated with the second PDSCH.

Example 44 comprises the subject matter of any variation of example 36, wherein the number of adjacent PRBs is six or fewer.

Example 45 comprises the subject matter of any variation of example 32, wherein the one or more parameters comprise one or more potential modulation schemes of the second PDSCH.

Example 46 comprises the subject matter of any variation of example 32, wherein the one or more parameters comprise one or more potential transmission schemes of the second PDSCH.

Example 47 comprises the subject matter of any variation of example 32, wherein the one or more parameters comprise a codebook of precoding vectors associated with the second PDSCH.

Example 48 comprises the subject matter of any variation of example 32, wherein the second TTI comprises seven or fewer orthogonal frequency division multiplexing (OFDM) symbols.

Example 49 is an apparatus configured to be employed within an Evolved NodeB (eNB), comprising means for communication and means for processing. The means for communication is configured to transmit control signaling to a first set of user equipments (UEs) to configure the first set of UEs for potential puncturing of a first physical downlink shared channel (PDSCH) by a second PDSCH having a shorter transmission time interval (TTI) than a first TTI of the first PDSCH. The means for processing is configured to: schedule the first PDSCH to a first set of physical resources; and schedule the second PDSCH to a second set of physical resources that comprises a punctured subset of the first set of physical resources. The means for communication is further configured to transmit a first set of data via the first PDSCH to the first set of UEs via a subset of the first set of physical resources that excludes the punctured subset, and to transmit a second set of data via the second PDSCH to a second set of UEs via the second set of physical resources.

Example 50 comprises the subject matter of any variation of example 49, wherein the control signaling indicates one or more parameters of the second PDSCH.

Example 51 comprises the subject matter of any variation of example 50, wherein the one or more parameters comprise one or more potential modulation orders of the second PDSCH.

Example 52 comprises the subject matter of any variation of example 50, wherein the one or more parameters comprise a power offset of the second PDSCH.

Example 53 comprises the subject matter of any variation of example 50, wherein the one or more parameters comprise one or more potential precoding matrices of the second PDSCH.

Example 54 comprises the subject matter of any variation of example 50, wherein the one or more parameters comprise a number of orthogonal frequency division (OFDM) symbols of the second PDSCH.

Example 55 comprises the subject matter of any variation of example 54, wherein the number of OFDM symbols of the second PDSCH is 7 or fewer.

Example 56 comprises the subject matter of any variation of any of examples 49-55, wherein the control signaling comprises one or more radio resource control (RRC) messages.

Example 57 comprises the subject matter of any variation of any of examples 49-55, wherein the control signaling comprises one or more downlink control information (DCI) messages.

Example 58 comprises the subject matter of any variation of any of examples 32-34, wherein the one or more control messages comprise at least one of a radio resource control (RRC) message or an additional downlink control information (DCI) message.

Example 59 comprises the subject matter of any variation of example 58, wherein the one or more control messages comprise the additional DCI message, and wherein the one or more processors being configured to process the one or more control messages comprises the one or more processors being configured to decode the additional DCI message.

Example 60 comprises the subject matter of any variation of any of examples 1-19, further comprising the transceiver circuitry.

Example 61 comprises the subject matter of any variation of any of examples 32-48, further comprising the transceiver circuitry.

Example 62 comprises the subject matter of any variation of any of examples 1-19, wherein the one or more control messages comprise at least one of a radio resource control (RRC) message or a downlink control information (DCI) message.

Example 63 comprises the subject matter of any variation of example 62, wherein the one or more control messages comprise the DCI message, and wherein the one or more processors being configured to output the one or more control messages comprises the one or more processors being configured to encode the DCI message.

Example 64 comprises the subject matter of any variation of any of examples 32-48, wherein the one or more processors are further configured to demodulate each signal associated with the first PDSCH.

The above description of illustrated embodiments of the subject disclosure, including what is described in the Abstract, is not intended to be exhaustive or to limit the disclosed embodiments to the precise forms disclosed.

While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. An apparatus configured to be employed within a Base station (BS), comprising one or more processors configured to:
    schedule a first set of physical resources for a first downlink (DL) transmission to a first user equipment (UE) according to a first transmission time interval (TTI);
    output one or more control messages to transceiver circuitry for transmission to the first UE, wherein the one or more control messages facilitate interference cancellation, by the first UE, of a second DL transmission for a second UE different than the first UE, wherein the one or more control messages comprise respective one or more radio resource control (RRC) messages that indicate a plurality of parameters of the second DL transmission, wherein the plurality of parameters of the second DL transmission comprise one or more potential modulation schemes of the second DL transmission and a codebook of precoding vectors associated with the second DL transmission;
    schedule a second set of physical resources for the second DL transmission to a second UE according to a second TTI that is shorter than the first TTI, wherein the second set of physical resources comprises a first subset of the first set of physical resources;
    map first modulated DL data for the first DL transmission to a first physical downlink shared channel (PDSCH) via a second subset of the first set of physical resources, wherein the second subset of the first set of physical resources excludes the first subset of the first set of physical resources; and map second modulated DL data for the second DL transmission to a second PDSCH via the second set of physical resources.

2. The apparatus of claim 1, wherein the one or more control messages indicate a potential puncturing of the first PDSCH by the second PDSCH.

3. The apparatus of claim 1, wherein the plurality of parameters of the second DL transmission comprise a virtual cell identity (ID) of a user-specific reference signal of the second DL transmission.

4. The apparatus of claim 1, wherein the plurality of parameters of the second DL transmission comprise a power offset of the second DL transmission.

5. The apparatus of claim 1, wherein the plurality of parameters of the second DL transmission comprise a transmission scheme of the second DL transmission.

6. The apparatus of claim 1, wherein the plurality of parameters of the second DL transmission comprise a number of orthogonal frequency division multiplexing (OFDM) symbols of the second DL transmission.

7. The apparatus of claim 6, wherein the number of OFDM symbols of the second DL transmission is seven or fewer.

8. The apparatus of claim 1, wherein the second set of physical resources comprises resource elements (REs) from n adjacent physical resource blocks (PRBs), and wherein the one or more parameters comprise n.

9. A non-transitory machine readable medium comprising instructions that, when executed, cause a Base Station (BS) to:
    transmit control signaling to a first set of user equipments (UEs) to configure the first set of UEs for potential puncturing of a first physical downlink shared channel (PDSCH) by a second PDSCH having a shorter transmission time interval (TTI) than a first TTI of the first PDSCH, wherein the control signaling comprises one or more radio resource control (RRC) messages that indicate a plurality of parameters of the second PDSCH, wherein the plurality of parameters comprise one or more potential modulation orders of the second PDSCH and comprise one or more potential precoding matrices of the second PDSCH;
    schedule the first PDSCH to a first set of physical resources;
    schedule the second PDSCH to a second set of physical resources that comprises a punctured subset of the first set of physical resources;
    transmit a first set of data via the first PDSCH to the first set of UEs via a subset of the first set of physical resources that excludes the punctured subset; and transmit a second set of data via the second PDSCH to a second set of UEs via the second set of physical resources, wherein each UE of the second set of UEs is different than each UE of the first set of UEs.

10. The machine readable medium of claim 9, wherein the plurality of parameters comprise a power offset of the second PDSCH.

11. The machine readable medium of claim 9, wherein the plurality of parameters comprise a number of orthogonal frequency division (OFDM) symbols of the second PDSCH.

12. The machine readable medium of claim 11, wherein the number of OFDM symbols of the second PDSCH is 7 or fewer.

13. An apparatus configured to be employed within a User Equipment (UE), comprising one or more processors configured to:
    process one or more control messages received via transceiver circuitry, wherein the one or more control messages comprise respective one or more radio resource control (RRC) messages that indicate potential puncturing of a first physical downlink shared channel (PDSCH) by a second PDSCH with a second transmission time interval (TTI) that is shorter than a first TTI of the first PDSCH, and indicate a plurality of indicated parameters of the second PDSCH, wherein the first PDSCH comprises data to be received by the UE, wherein the second PDSCH is potentially interfering with the first PDSCH, and wherein the plurality of parameters comprise one or more potential modulation schemes of the second PDSCH and comprise a codebook of precoding vectors associated with the second PDSCH;

decode a downlink control information (DCI) message received via the transceiver circuitry, wherein the DCI message indicates a downlink (DL) assignment scheduled for the UE via an indicated set of physical resources;

process a set of signals received via the transceiver circuitry via the indicated set of physical resources;

determine, based on the plurality of indicated parameters, whether each signal of the set of signals is associated with the first PDSCH or associated with the second PDSCH; and discard each signal associated with the second PDSCH.

14. The apparatus of claim 13, wherein the one or more processors being configured to determine whether each signal of the set of signals is associated with the first PDSCH or associated with the second PDSCH comprises the one or more processors being configured to:

calculate one or more estimated parameters of the respective signal; and compare the one or more estimated parameters of the respective signal with the plurality of indicated parameters.

15. The apparatus of claim 13, wherein the one or more processors being configured to determine whether each signal of the set of signals is associated with the first PDSCH or associated with the second PDSCH comprises the one or more processors being configured to:

calculate an expected covariance matrix for the respective signal based on the one or more indicated parameters;

calculate an actual covariance for the respective signal based on the respective signal; and compare the expected covariance matrix of the respective signal with the actual covariance matrix of the respective signal.

16. The apparatus of claim 13, wherein the one or more processors being configured to discard each signal associated with the second PDSCH comprises the one or more processors being configured to assign a log likelihood ratio (LLR) value of zero for each signal associated with the second PDSCH.

17. The apparatus of claim 13, wherein the plurality of parameters comprise a number of adjacent physical resource blocks (PRBs) of a group of adjacent PRBs of the second PDSCH, and wherein, for at least one signal of the set of signals, the one or more processors are configured to determine the at least one signal is associated with the second PDSCH based on a determination that the at least one signal is within the group of adjacent PRBs with another signal associated with the second PDSCH.

18. The apparatus of claim 13, wherein the plurality of parameters comprise one or more potential transmission schemes of the second PDSCH.

19. The apparatus of claim 13, wherein the second TTI comprises seven or fewer orthogonal frequency division multiplexing (OFDM) symbols.

* * * * *